United States Patent [19]

Sando et al.

[11] 4,437,324

[45] Mar. 20, 1984

[54] APPARATUS FOR TREATING A CLOTH CONTINUOUSLY WITH THE USE OF LOW-TEMPERATURE PLASMA

[75] Inventors: Yoshikazu Sando, Wakayama; Tokuju Goto, Nara; Itsuo Tanaka, Osaka; Hiroshi Ishidoshiro; Matsuo Minakata, both of Wakayama, all of Japan

[73] Assignee: Sando Iron Works Co., Ltd., Wakayama, Japan

[21] Appl. No.: 452,786

[22] Filed: Dec. 27, 1982

[30] Foreign Application Priority Data

Jan. 6, 1982 [JP] Japan .................................. 57-818

[51] Int. Cl.³ .......................... D06B 3/12; D06B 23/00
[52] U.S. Cl. ........................................... 68/5 E; 8/444; 118/50.1; 118/718; 118/723; 219/121 P
[58] Field of Search ................. 68/5 D, 5 E; 8/149.2, 8/444; 427/38, 39; 118/50.1, 718, 723; 204/298; 34/36, 92; 219/121 P, 121 PY, 121 PD, 121 PE, 121 PF, 121 PG

[56] References Cited

U.S. PATENT DOCUMENTS

| | | | |
|---|---|---|---|
| 3,396,415 | 8/1968 | Meier-Windhorst | 68/5 E X |
| 3,823,489 | 7/1974 | Boom | 68/5 E X |
| 4,123,663 | 10/1978 | Koriike | 204/298 X |
| 4,262,631 | 4/1981 | Kobacki | 427/39 X |
| 4,389,970 | 6/1983 | Edgerton | 118/718 X |

*Primary Examiner*—Philip R. Coe
*Attorney, Agent, or Firm*—Toren, McGeady and Stanger

[57] ABSTRACT

An apparatus for treating a cloth continuously with the use of low-temperature plasma comprising a reactor provided with seal mechanisms, a plurality of cloth guide rolls provided up and down in the reactor for transporting a cloth zigzag forming snaky undulations, a plurality of partition walls provided up and down alternately in the reactor for forming zigzag cloth passages to transport the cloth therebetween, a gas supply opening provided in the vicinity of the cloth outlet for jetting a gas to the zigzag cloth passages, a pair of electrode plates provided in adjacent to the gas supply opening for producing low-temperature plasma with the combined use of high frequency electric wave applied thereto and the gas jetted from the gas supply opening, and a vacuum duct provided in the vicinity of the cloth inlet of the reactor. It is preferable further to provide a plurality of electrode pairs in the reactor by putting the zigzag cloth passages therebetween. The treatment of a cloth, for instance souring and finishing, can be done eminently with the use of this apparatus.

2 Claims, 2 Drawing Figures

APPARATUS FOR TREATING A CLOTH CONTINUOUSLY WITH THE USE OF LOW-TEMPERATURE PLASMA

BACKGROUND OF THE INVENTION

The present invention relates to an apparatus for treating a cloth such as knitted, woven and non-woven ones continuously with the use of low-temperature plasma.

There are such processes as pretreatment and finishing treatment for treating a cloth continuously. In the pretreatment of a cloth prior to dyeing, for instance, there is a process of scouring, in which water repellent foreign matters adhering to the cloth are removed or made into hydrophilic for facilitating the permeation of dye solution in the cloth, in the finishing treatment of a cloth after dyeing, the cloth is made into soft, water repellent, antielectrostatic, soil release, waterproof and so on, and these treatments are done in an aqueous system.

For instance, in the scouring treatment of a cloth containing cotton, the cloth is treated with an alkaline solution containing such an agent as caustic soda or soda ash with an auxiliary agent for scouring by boiling or by steaming for making water repellent foreign matters water soluble, the cloth is repeatedly washed with water for removing the solubilized foreign matters and the agents adhering to the cloth, and the cloth is finally dried. In the finishing process, the cloth is treated with a finishing agent dissolved or dispersed in water and filtered, and then water is evaporated by passing the cloth through a drier. According to the kind of treatment, it is necessary further to fix the finishing agent to the cloth by a high temperature heat treatment.

In these processes, however, the treating agent is costly, a large quantity of heat is necessary for the reaction between the agent and the cloth, a large quantity of water is needed for washing the treated cloth and an apparatus is necessary for the abandonment of waste water, so that it is the present status that large quantities of water resource and heat energy must be consumed for subjecting a cloth to the above-mentioned treatments. Furthermore, since the waste solutions of these treatments contain unavoidably a large quantity of the agent employed, there occurs a problem of public pollution, accompanying uneconomical countermeasures therefor.

SUMMARY OF THE INVENTION

Under such circumstances, the object of the present invention is to offer an apparatus for treating a cloth continuously with the use of a limited amounts of heat energy and water resource.

The principle of the invention is to transport a cloth to be treated through an atmosphere of low-temperature plasma continuously for subjecting the cloth to the action of low-temperature plasma. Thus, in the scouring process, water repellent foreign matters adhering to the cloth are decomposed by oxidation for making the foreign matters hydrophilic, and particularly the scouring effect can reach up to the core part of the fibers constituting the cloth, and in the finishing process, not only the treatment can be done in a gas phase but also the agent, heat energy and water resource can remarkably be spared as compared with the conventional processes, and consequently the treatment of the waste water can be facilitated.

DETAILED DESCRIPTION OF THE PREFERRED EMBODIMENTS

The preferred embodiments of the present invention will be described in detail in the following with reference to the attached drawings.

Figure 1:
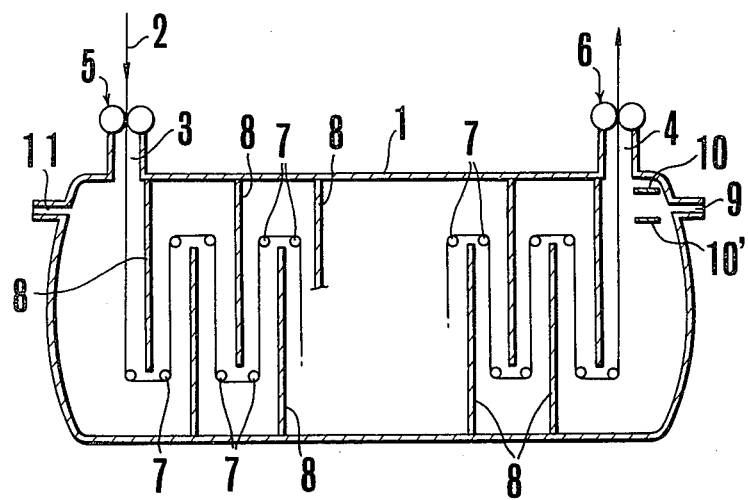
FIG. 1 is to show an example of the present inventive apparatus for treating a cloth continuously with the use of low-temperature plasma.

In FIG. 1, 1 is a reactor, and the reactor 1 is provided with a cloth inlet 3 and a cloth outlet 4 for taking in and out of a cloth to be treated 2 continuously through the reactor 1. The cloth inlet 3 and cloth outlet 4 are provided respectively with seal mechanisms 5 and 6 which enable to maintain the interior of the reactor 1 to reduced pressure (with a vacuum degree of 0.1 to 10 Torr or desirably 0.5 to 2 Torr). As for the seal mechanisms 5 and 6, any one developed by the present inventors may be employed.

7 are a plurality of cloth guide rolls provided up and down zigzag in two stages in the reactor 1 for transporting the cloth zigzag forming snaky undulations through the reactor. 8 are a plurality of partition walls provided up and down alternately in the reactor 1 for forming cloth passages to transport the cloth guided by the cloth guide rolls up and down therebetween and for passing a gas through the cloth passages. 9 is a gas supply opening provided in the vicinity of the cloth outlet 4, and 10 and 10' are a pair of electrode plates provided near the gas supply opening 9 in the reactor 1 for applying high frequency electric wave thereto, 11 is a vacuum duct provided near the cloth inlet 3 of the reactor 1 and is connected to a vacuum pump not shown in the drawing.

The construction of the present inventive apparatus in this example is as above described. Now, its functions will be described.

The vacuum pump connecting to the vacuum duct 11 (not shown in the drawing) is driven firstly to evacuate the interior of the reactor 1 to a vacuum degree of not more than 1 Torr or desirably not more than 0.5 Torr, and the vacuum degree of the interior of the reactor 1 is controlled to 0.1 to 10 Torr or desirably to 0.5 to 2 Torr by supplying a defined gas from the gas supply opening 9 and exhausting the gas through the vacuum duct 11. The reason why the vacuum degree in the reactor is defined to 0.1 to 10 Torr is that the formation of low-temperature plasma becomes unstable when the vacuum degree is not less than 10 Torr, and on the other hand that, when the vacuum degree is not more than 0.1 Torr, not only the maintenance and operation costs become high in the points of the capacity of the pump and the sealing mechanisms but also the concentration of the low-temperature plasma becomes low to deteriorate the efficiency of the treatment.

When the vacuum degree of the interior of the reactor 1 is controlled in this way, high frequency electric wave with a frequency of, desirably, 1 KHz to 300 MHz is applied to the electrode plates 10 and 10', and low-temperature plasma is produced from the electrode plate 10 and 10' in the reactor 1. This low-temperature plasma is transferred due to the action of the vacuum duct 11 in the direction of the vacuum duct 11 through the spaces between the partition walls 8. The cloth goes from the cloth inlet 3 to the direction of the cloth outlet 4 continuously forming snaky undulations, so that the low-temperature plasma is transferred countercurrently to the passing direction of the cloth, and the low-temperature plasma treatment of a cloth can be done effectively and efficiently.

Figure 2:
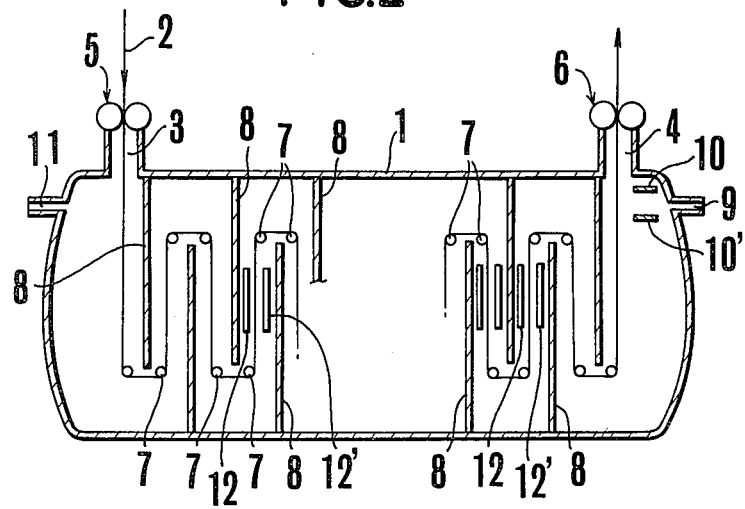
FIG. 2 is to show a modification of the apparatus in FIG. 1.

A modification of this apparatus shown in FIG. 2 is to provide a plurality of electrode pairs 12 and 12' by putting the cloth therebetween for producing high frequency electric wave to activate the gas again in the course when the cloth is passing through the zigzag cloth passages. In this modification, the efficiency of the treating effect can still further be elevated.

As above described in detail, the present invention relates to an apparatus for treating a cloth continuously with the use of low-temperature plasma comprising a reactor provided with seal mechanisms which can allow the continuous taking in and out of a cloth to be treated through the reactor while maintaining the interior of the reactor to reduced pressure, a plurality of cloth guide rolls provided up and down in the reactor for transporting the cloth zigzag forming snaky undulations, a plurality of partition walls provided up and down alternately in the reactor for forming zigzag cloth passages to transport the cloth therebetween forming snaky undulations, a gas supply opening provided in the vicinity of the cloth outlet of the reactor for jetting a gas to the zigzag cloth passages, a pair of electrode plates provided adjacent to the gas supply opening for producing low-temperature plasma with the combined use of high frequency electric wave applied thereto and the gas jetted from the gas supply opening, and a vacuum duct provided in the vicinity of the cloth inlet of the reactor. A plurality of electrode pairs may be provided by putting the zigzag cloth therebetween in the reactor for activating the gas again in order to elevate the efficiency of the treatment still more.

In the present inventive apparatus, low-temperature plasma flows countercurrently to the cloth, so that the effect of low-temperature plasma to the cloth can be elevated and the plasma is used completely. Furthermore, since the cloth is transported zigzag forming snaky undulations, the treating time thereof with low-temperature plasma can be prolonged. Therefore, a cloth can be treated with the use of low-temperature plasma effectively and economically with a limited use of treating agents, water and heat energy, and thus the problem of public pollution can be eliminated.

What we claim:

1. An apparatus for treating a cloth continuously with the use of low-temperature plasma, comprising a reactor provided with seal mechanisms which can allow continuous taking in and out of a cloth to be treated through the reactor while maintaining the interior of the reactor under a reduced pressure, a plurality of cloth guide rolls provided up and down in the reactor for transporting the cloth zigzag forming snaky undulations, a plurality of partition walls provided up and down alternately in the reactor for forming zigzag cloth passages to transport the cloth therebetween forming snaky undulations, a gas supply opening provided in the vicinity of the cloth outlet of the reactor for jetting a gas to the zigzag cloth passages, a pair of electrode plates provided adjacent to the gas supply opening for producing low-temperature plasma with combined use of high frequency electric wave applied thereto and the gas jetted from the gas supply opening, and a vacuum duct provided in the vicinity of the cloth inlet of the reactor.

2. An apparatus for treating a cloth continuously with the use of low-temperature plasma according to claim 1, in which a plurality of electrode pairs are provided further in the reactor forming a zigzag cloth passages therebetween.

* * * * *